(12) United States Patent
Brokaw

(10) Patent No.: US 7,288,993 B2
(45) Date of Patent: Oct. 30, 2007

(54) SMALL SIGNAL AMPLIFIER WITH LARGE SIGNAL OUTPUT BOOST STAGE

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 86 days.

(21) Appl. No.: 11/313,545

(22) Filed: Dec. 20, 2005

(65) Prior Publication Data

US 2006/0164170 A1   Jul. 27, 2006

Related U.S. Application Data

(60) Provisional application No. 60/741,142, filed on Nov. 30, 2005, provisional application No. 60/647,299, filed on Jan. 25, 2005.

(51) Int. Cl.
*H03F 3/16* (2006.01)

(52) U.S. Cl. ..................... 330/300; 330/261

(58) Field of Classification Search ............. 330/253, 330/257, 260, 261, 300
See application file for complete search history.

(56) References Cited

U.S. PATENT DOCUMENTS

| 3,636,464 A | 1/1972 | Gilbert ................ 330/24 |
| 6,005,440 A | 12/1999 | Okamoto ............. 330/253 |
| 6,317,000 B1 * | 11/2001 | Ivanov et al. ......... 330/255 |
| 6,359,512 B1 * | 3/2002 | Ivanov et al. ......... 330/255 |
| 2003/0063503 A1 | 4/2003 | Kiuchi et al. | |

FOREIGN PATENT DOCUMENTS

EP    1387493 A2    2/2004

OTHER PUBLICATIONS

Mancini, Ron; "Anatomy of a Current-Feedback of AMP"; EDN; Dec. 5, 2005; p. 40.
PCT International Search Report; Feb. 15, 2007; 6 pps.; in International Application No. PCT/US2006/039097.
PCT Written Opinion of the International Searching Authority; Feb. 15, 2007; in International Application No. PCT/US2006/039097.

* cited by examiner

*Primary Examiner*—Henry Choe
(74) *Attorney, Agent, or Firm*—Koppel, Patrick, Heybl & Dawson

(57) ABSTRACT

A small signal amplifier with a large signal output boost stage are connected between first and second supply rails. The small signal amplifier receives first and second input signals and provides an output signal at an output node which drives a load. Under small signal conditions, the output signal varies approximately linearly with the difference voltage. However, under large signal conditions, a rail-to-rail large signal output boost stage connected to the output node is arranged to drive the output node close to the first or second supply rail as needed to provide the current demanded by the load. The large signal output boost stage is off in small signal conditions, but comes on rapidly and transfers maximum charge to the load under large signal conditions.

20 Claims, 3 Drawing Sheets

SMALL SIGNAL AMPLIFIER WITH LARGE SIGNAL OUTPUT BOOST STAGE

RELATED APPLICATIONS

This application claims the benefit of provisional patent application No. 60/647,299 to Brokaw, filed Jan. 25, 2005, and of provisional patent application No. 60/741,142 to Brokaw, filed Nov. 30, 2005.

BACKGROUND OF THE INVENTION

1. Field of the Invention

This invention relates to the field of amplifiers, and particularly to amplifier circuits capable of providing large load currents on demand.

2. Description of the Related Art

In some applications, an amplifier may be called upon to deliver a charge to a load. For example, a typical LCD display is made up of pixels, with each pixel's optical transmission controlled by a voltage stored on a pixel capacitance. When numerous stored voltages are to be changed simultaneously, a large amount of charge must be driven into the panel to image the changes. An amplifier providing this charge may be configured to provide a desired small signal response. However, the desired small signal response may cause the output to be overdriven when large amounts of charge are called for, and thus unable to deliver the currents demanded by the load.

SUMMARY OF THE INVENTION

An amplifier circuit comprising a small signal amplifier with a large signal output boost stage is presented which addresses the problems noted above, in that it provides a desired small signal response, as well as large currents that may be demanded by the load.

The present amplifier circuit includes a small signal amplifier and a large signal output boost stage connected between first and second power supply rails. The small signal amplifier receives first and second input signals at respective input nodes and provides an output signal at an output node to which a load is connected. When the difference voltage between the input signals is less than a predetermined threshold (i.e., small signal), the output signal varies approximately linearly with the difference voltage. However, when the difference voltage is greater than the predetermined threshold (i.e., large signal), a rail-to-rail large signal output boost stage connected to the output node is arranged to drive the output node close to the first or second supply rail as needed to provide the current demanded by the load. The large signal output boost stage is off in small signal conditions, simplifying its biasing and allowing low power operation when only small signals are present. But the output stage comes on rapidly and transfers maximum charge to the load under large signal conditions. In this way, the present amplifier circuit supplies load currents that would otherwise overload the small signal amplifier.

Further features and advantages of the invention will be apparent to those skilled in the art from the following detailed description, taken together with the accompanying drawings.

DETAILED DESCRIPTION OF THE INVENTION

The present invention is an amplifier circuit capable of providing an accurate small signal response, and of supplying large currents when a large signal response is called for by the load being driven. This is accomplished by combining a small signal amplifier with a large signal output boost stage.

Figure 1:
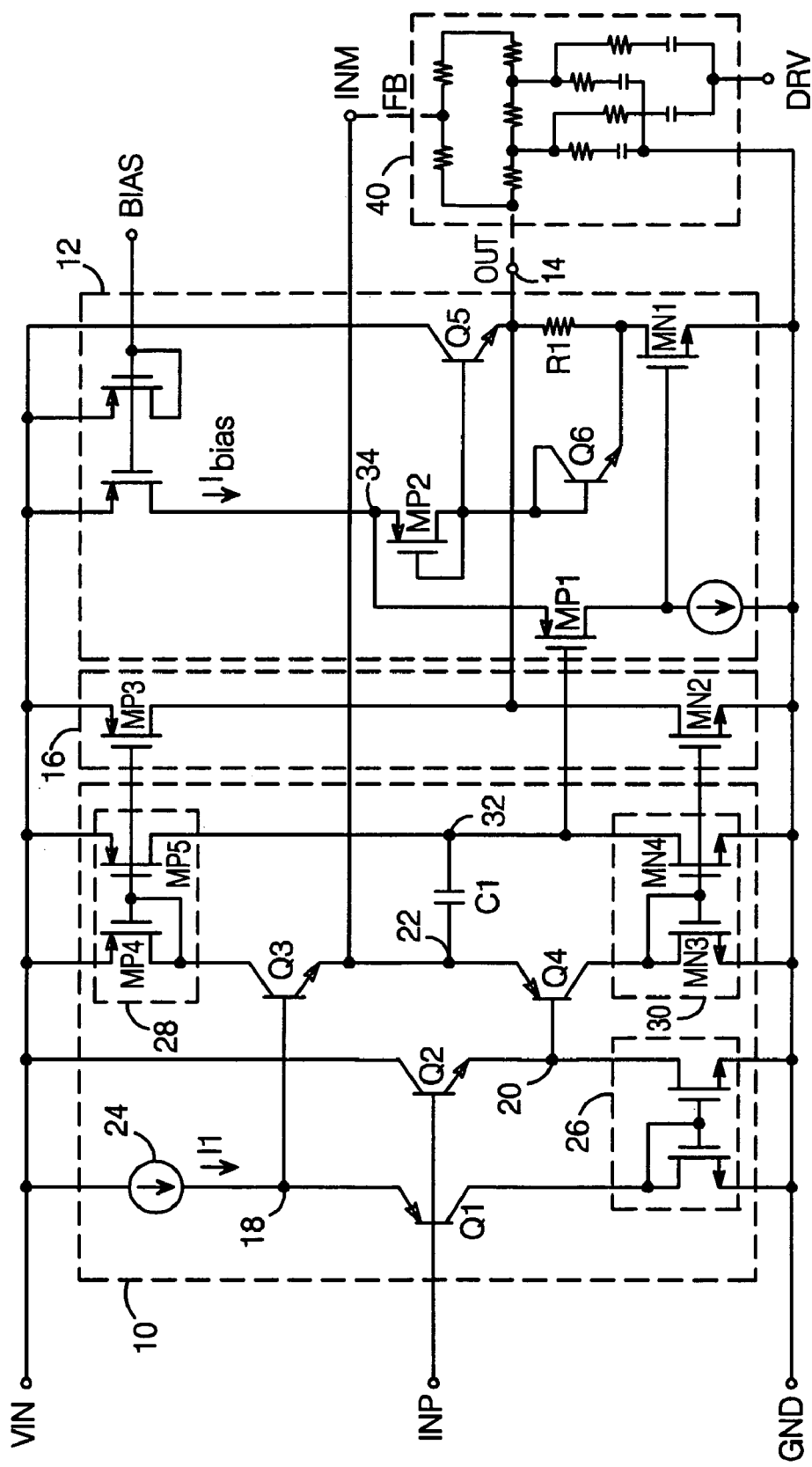
FIG. 1 is a schematic diagram of one possible embodiment of a small signal amplifier with a large signal output boost stage per the present invention.

An exemplary embodiment of the present amplifier circuit is shown in FIG. 1. The amplifier circuit includes a small signal amplifier comprising a first stage 10 and an output stage 12 which drives an output node 14, and a large signal output boost stage 16 which is also connected to drive output node 14. The amplifier circuit is connected between first and second power rails, labeled in FIG. 1 as VIN and GND, though both rails could be at non-zero potentials.

The small signal amplifier is suitably configured as a current feedback amplifier. Here, first stage 10 comprises first and second transistors (Q1, Q2) of opposite polarity; Q1 and Q2 are shown as bipolar transistors in FIG. 1, though FETs could also be used. Q1 and Q2 have their bases coupled to a first input node INP which serves as the small signal amplifier's non-inverting input, and are biased to operate as emitter followers: Q1 and Q2 shift the level of an input signal up and down, respectively; the level-shifted results appear at nodes 18 and 20, respectively. Opposite polarity transistors Q3 and Q4 are driven by nodes 18 and 20, respectively, and serve to shift the input signal level back down (Q3) and up (Q4) to a node 22, which serves as the small signal amplifier's inverting input INM.

First stage 10 is preferably arranged such that Q1-Q4 are operated at about equal currents. A current source 24 provides a bias current I1; after flowing through Q1, most of I1 is mirrored to Q2 and the base of Q4 via a current mirror 26. Q1-Q4 are sized such that their respective base-emitter voltages are approximately equal when conducting equal currents. As a result, the current through Q3 and Q4 should approximate the square root of the product of the Q1 and Q2 currents, which is about the same as I1.

Currents in Q3 and Q4 are mirrored by current mirrors 28 and 30, respectively, such that their difference appears at a node 32. Node 32 is very lightly loaded, so that a small difference in the Q1 and Q2 currents results in large signal swings at node 32, limited by the compliance and output impedance of mirrors 28 and 30.

Input node INM presents a low input impedance. As a result, if a signal presented at INM differs from zero, a net current will flow into INM and be delivered to node 32 by current mirrors 28 and 30. This current not only drives output stage 12, but also charges a frequency compensating capacitor C1 which is preferably connected between nodes 22 and 32.

The signal at node 32 drives the small signal amplifier's output stage 12, which provides an output signal (OUT) to output node 14. The small signal amplifier is at equilibrium when OUT=INP=INM. When arranged as shown, the signal at node 32 responds very rapidly to a non-zero difference voltage between INM and INP. Since INM is the inverting input, the small signal amplifier will drive OUT in opposition to the difference to try and restore equilibrium.

Output stage 12 is preferably configured as a totem pole output; one possible arrangement is shown in FIG. 1. A transistor MP1 is connected to act as a level shifter and follower for signals at node 32, providing the level shifted signal at a node 34 to which a bias current $I_{bias}$ is provided; $I_{bias}$ is generated, for example, with a current mirror driven by a current applied to a BIAS node. A diode-connected FET MP2 is connected between node 34 and the base of a transistor Q5, which has its collector-emitter circuit connected between VIN and OUT. $I_{bias}$ drives Q5 by way of MP2, causing Q5 to pull up on OUT. However, as the output rises, the voltage at node 34 also rises, and diverts some of $I_{bias}$ into MP1 when OUT approaches the voltage at node 32. This diverted current causes MP1 to pull up the gate of a FET MN1 connected between OUT and GND by way of a resistance R1, turning MN1 on. MN1's drain current is directed to the load driven by OUT by R1. The resulting voltage developed across R1 pulls down the emitter of a transistor Q6, which is diode-connected to the base of Q5. Further increases in the MN1 current steal away the bias current driving the base of Q5, and so restrict the positive swing of the output.

Thus, for a given voltage at node 32, $I_{bias}$ drives the base of Q5 by way of MP2, and Q5 acts as a follower to drive the load. As OUT approaches the voltage at node 32, bias current is diverted through MP1, turning on MN1 and thereby reducing the drive to Q5 so as to hold the output voltage at a level fixed by the node 32 voltage. This local loop results in relatively low open loop output impedance, and has large bandwidth.

When node 32 is driven low, OUT will follow, and since it is driven low by MN1, it can approach the lower power rail GND. The Q6, R1 arrangement limits the shoot through current in Q5 and MN1 under no load, and allows a low impedance pseudo-class A operation over a range of outputs near the lower power rail. MP2 and the base-emitter voltage of Q5 limit the positive output swing.

The small signal amplifier may be lightly loaded in some modes of operation, and a desire to keep the operating bias and shoot through current low results in output stage 12 having a relatively low current limit, with the negative drive limited by R1. However, in some applications, the load being driven by the small signal amplifier may occasionally demand large currents that exceed the capabilities of output stage 12.

One such application is that of providing a "Vcom" voltage to an LCD panel comprising multiple pixels. The load (40) presented by such a panel is modeled as shown in FIG. 1. Typically, each pixel's optical transmission is controlled by a voltage stored on a pixel capacitance connected between a drive voltage and a voltage "Vcom", here provided as the output of the present amplifier circuit; a desired Vcom voltage is applied at INP. In the greatly simplified schematic of load 40 shown in FIG. 1, the DRV node represents the effect of charging a large number of pixels of one row in the same direction. Doing so acts like a positive or negative step of voltage on DRV. A feedback voltage (FB) is taken which indicates the net charge put into the panel by one row of pixels. For example, if the majority of pixel capacitances in one row are driven positive during a refresh operation, the FB node will be driven positive. This positive pulse is coupled to inverting input INM, resulting in a negative swing at OUT. This output drives the panel negative, resulting in a large negative charge being swept into the distributed network of the panel. As the charge equilibrates, the overdrive at the FB node will be reduced and the amplifier circuit output will move towards the Vcom voltage applied at INP.

For some signal patterns in the LCD panel, a large amount of charge must be driven into the panel to image the changes in the pixel driving charge. Since the negative excursion of the small signal amplifier is limited to the difference between the Vcom input voltage and the supply rail, the small signal amplifier will be unable to respond linearly. When these large overdrives are present, the output voltage would ideally swing to its maximum as quickly as possible, and when the overdrive settles out the amplifier should recover to linear operation and restore normal operating voltage to the panel.

The present amplifier circuit accomplishes this non-linear response by means of large signal output boost stage 16, which comprises additional output drivers that switch on when large currents are demanded by the load being driven. One possible implementation of such a stage (16) is shown in FIG. 1. A FET MP3 is connected between VIN and OUT and driven by Q3's collector voltage, and a FET MN2 is connected between OUT and GND and driven by Q4's collector voltage. Thus, MP3 and MN2 directly drive OUT, bypassing totem pole output stage 12.

To ensure accurate small signal performance, large signal output boost stage 16 is preferably arranged to come on only during large signal conditions. One way in which this can be achieved is by making FETs MP3 and MN2 DMOS devices, with the FETs making up current mirror 28 (MP4, MP5) and 30 (MN3, MN4) being regular MOS devices. The threshold voltages of the DMOS devices are larger than those of the regular MOS devices; as such, little or no current flows in MP3 or MN2 under normal equilibrium conditions. However, if INM is driven positive, for example, causing Q4 to deliver a much larger current, the voltage across MN3 will rise and turn on MN2. Since MN2 is much larger than MN3, once activated it can supply much more current than MN4, such that the MN2 current directly drives OUT very close to the negative rail while supplying the large currents demanded by the load. Similarly, if INM is driven low, the Q3 current is increased. Here, the increasing voltage across MP4 turns on MP3 to directly drive the output close to the positive rail.

A disadvantage of the large signal output boost stage 16 implementation shown in FIG. 1 is that, in order to drive DMOS FETs MP3 or MN2 to conduct large currents, it is necessary to develop a voltage across mirrors 28 or 30 that is several volts higher than the DMOS FETs' threshold voltages. This requires an amount of current from Q3 or Q4 that may be unacceptably high. Moreover, variability in manufacture between the MOS and DMOS thresholds means that the actual current level needed for a given output can be quite variable.

Figure 2:
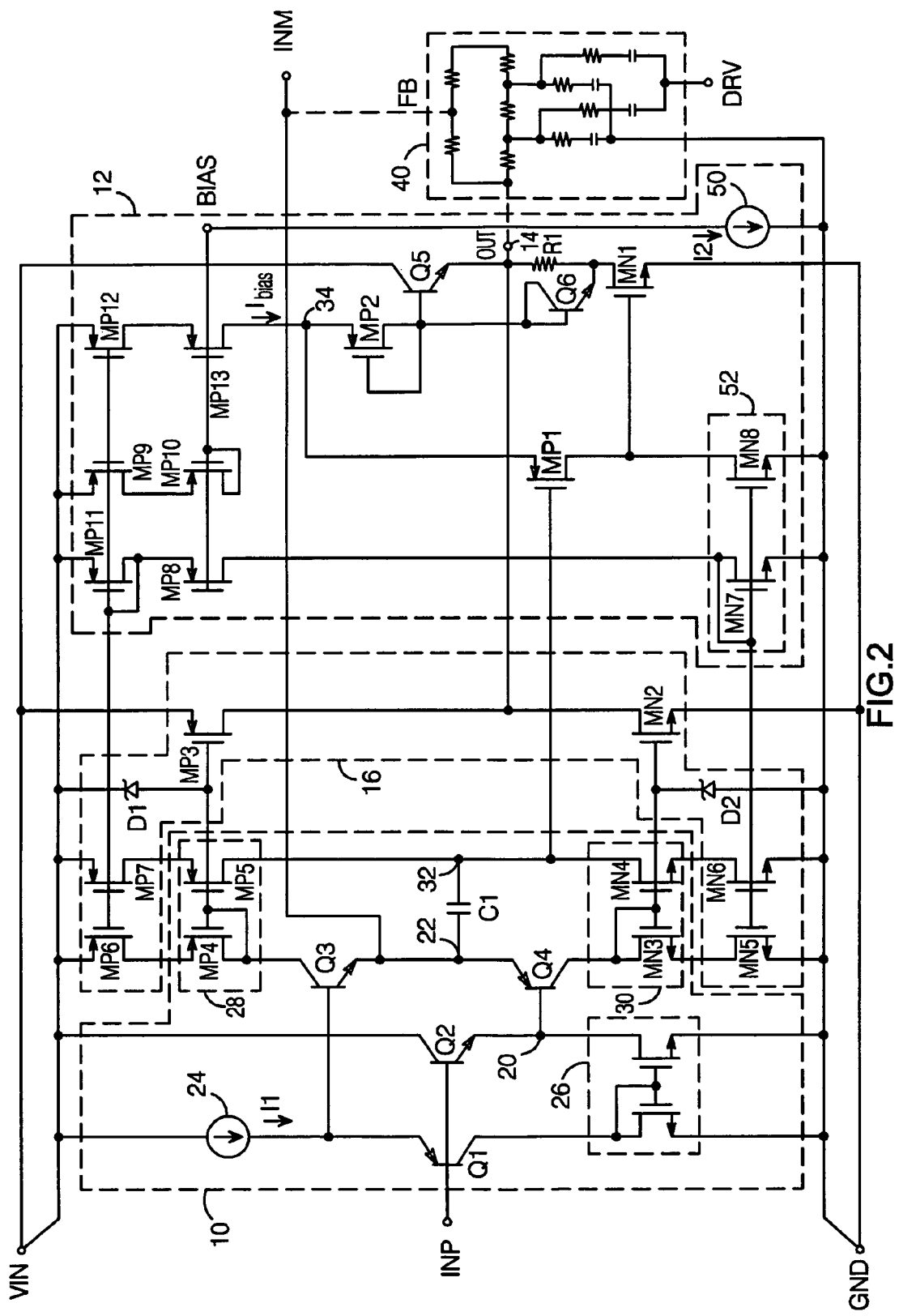
FIG. 2 is a schematic diagram of another possible embodiment of a small signal amplifier with a large signal output boost stage per the present invention.

This disadvantage is eliminated with the preferred large signal output boost stage implementation shown in FIG. 2. Here, saturating current mirrors are placed in series with mirrors 28 and 30, to reduce and give better control over the current level required to trigger the large signal response. FETs MP6 and MP7 are inserted in series between VIN and FETs MP4 and MP5, respectively, and FETs MN5 and MN6 are inserted in series between GND and FETs MN3 and MN4, respectively.

MP6 and MP7 are biased and sized such that, under small signal conditions, they operate in the triode region and act as degeneration for MP4 and MP5. However, if the small signal amplifier's operating equilibrium is disturbed by INM being pulled low, for example, a much larger current will flow from Q3. As this current rises, MP6 will be pulled out of triode operation and into current saturation. This causes the gate of MP3 to be pulled low. This causes DMOS FET MP3 to turn on, making it capable of delivering a large current to the load while it drives the load voltage close to VIN. A protection circuit, preferably a zener diode D1, protects mirror 28 as well as the gate of MP3 from excess voltage.

As MP6 leaves the triode region and enters current saturation, the impedance at the gate of MP4 will rise, causing the amplifier circuit to enter a high "gain" condition. However, since this happens during an input overload condition, the actual loop gain will be low, particularly once MP3 is in triode operation, so that frequency stability should not be a problem.

As the demand for a large load current becomes satisfied, the feedback to INM should rebalance the input, allowing the MP4 voltage to return to its initial voltage and thereby turn off MP3, and the amplifier circuit will resume small signal operation.

Similarly, MN5 and MN6 are biased and sized such that they operate in the triode region and act as degeneration for MN3 and MN4 under small signal conditions. If INM is overdriven in the positive direction, Q4 will deliver a large current to MN5 by way of MN3. This will cause MN5 to go into current saturation, allowing the gate node of MN3, MN4, and MN2 to swing positive. In small signal operation, this gate line is at or below the threshold voltage of MN2, so that MN2 is off. In the positive overload state, however, DMOS FET MN2 is turned on and is capable of delivering a large current to the load while it drives the load voltage close to GND. This maximizes the charge delivered to the load during positive overload events. Assuming that the charge delivered can restore the load's feedback voltage, the overload on INM will clear, the gate voltage of MN2 will drop, and the amplifier circuit will resume small signal operation. A zener diode D2 protects mirror 30 as well as the gate of MN2 from excess voltage.

An exemplary bias current arrangement is also shown in FIG. 2. A bias current source 50 provides a current I2, which pulls down on the gate of a PMOS FET MP8. This causes MP8 to pull down on the gate of a FET MP9, turning it on such that its current flowing in MP10 rises to match bias current I2. This is an equilibrium point, with the gate voltage of MP8 stabilized so as to bias MP9 to match I2. This also stabilizes the gate voltage of other PMOS devices referred to VIN, such as diode-connected FET MP11, so that they deliver an image of the I2 current; this mirroring arrangement might also be used to generate bias current I1 from current source 24, if not separately provided for. The MP11 current is used to set the operating point of a multiple output mirror 52 (which includes FETs MN7 and MN8) on the bottom power rail. The MP9 gate voltage also drives MP12 to deliver $I_{bias}$, which is cascoded with MP13 to stabilize the current over the output voltage swing as well as shielding MP12 from excess voltage.

When so arranged, the saturation level for MP6 and MP7 depends on their relative sizes with respect to MP9, and the saturation level for MN5 and MN6 depends on their relative sizes with respect to MN7.

Note that the biasing scheme shown is merely exemplary; there are myriad ways in which the necessary bias currents could be generated.

Figure 3:
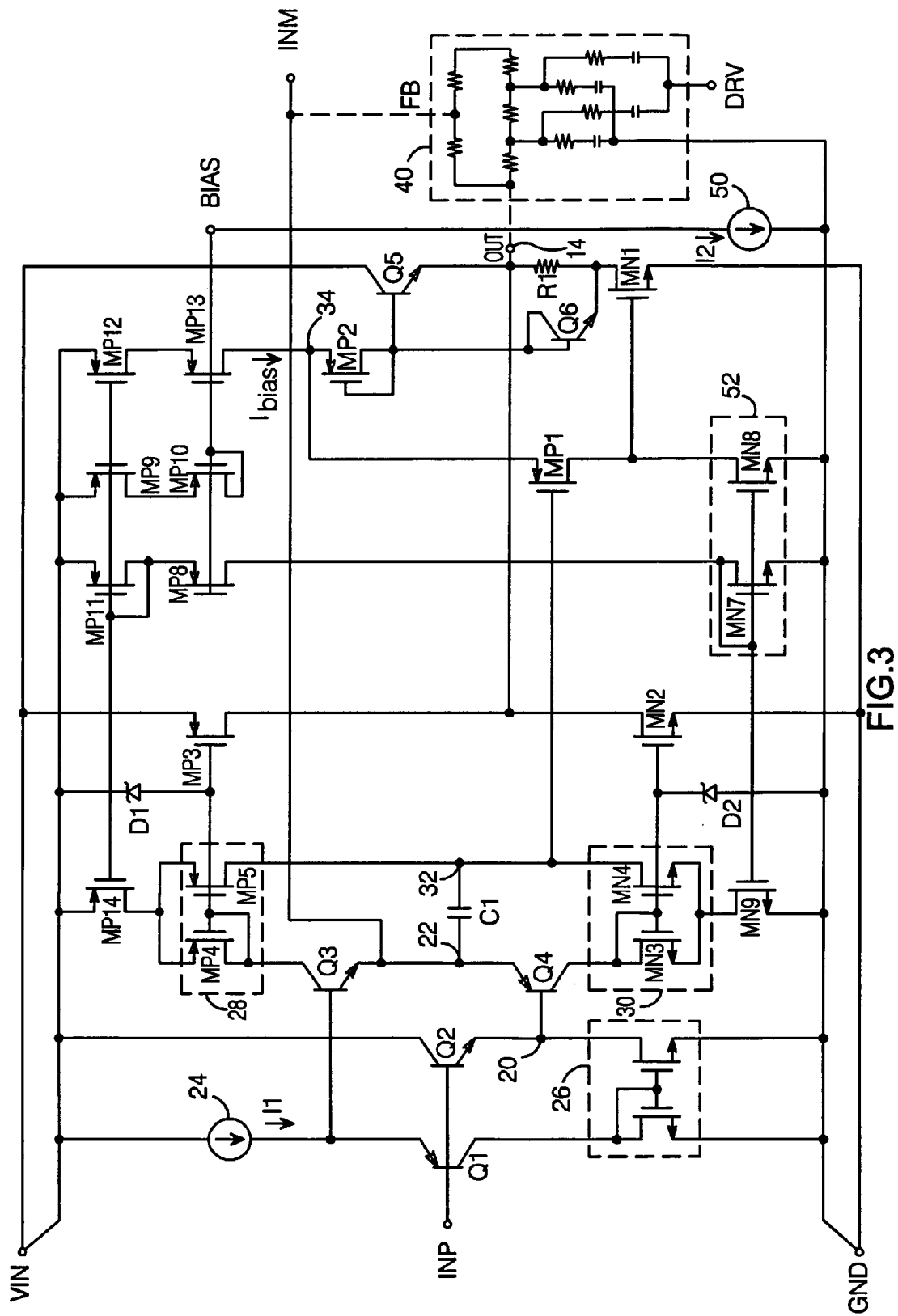
FIG. 3 is a schematic diagram of another possible embodiment of a small signal amplifier with a large signal output boost stage per the present invention.

The dual saturating mirrors (MP6/MP7, MN5/MN6) placed in series with mirrors 28 and 30 as shown in FIG. 2 might alternatively be implemented with single transistors, as shown in FIG. 3. The schematic of FIG. 3 is identical to that of FIG. 2, except that MP6/MP7 are replaced with a FET MP14, and MN5/MN6 are replaced with a FET MN9. Operation is as before: if INM is overdriven in the positive direction, MN9 goes into current saturation, allowing the gate node of MN3, MN4, and MN2 to swing positive such that MN2 is turned on. If INM is overdriven in the negative direction, MP14 goes into current saturation, allowing the gate node of MP4, MP5 and MP3 to swing negative such that MP3 is turned on.

As shown in FIGS. 2 and 3, each supply rail preferably comprises at least two branches, with the supply rail branches powering the small signal amplifier being different from the branches powering the large signal output boost stage.

Note that the implementations shown in FIGS. 1-3 are merely exemplary; the present invention could be realized using many different circuit configurations. It is only essential that an amplifier circuit in accordance with the present invention include a small signal amplifier which provides an output signal which varies approximately linearly with the difference voltage between its input signals when the difference voltage is less than a predetermined threshold—i.e., under small signal conditions, and a large signal output boost stage connected to the output node which is arranged to drive the output close to one of the amplifier circuit's supply rails when the difference voltage is greater than the predetermined threshold—i.e., under large signal conditions, thereby enabling large currents that may be demanded by the load to be supplied.

While particular embodiments of the invention have been shown and described, numerous variations and alternate embodiments will occur to those skilled in the art. Accordingly, it is intended that the invention be limited only in terms of the appended claims.

I claim:

1. An amplifier circuit, comprising:
  first and second power supply rails, said first rail being positive with respect to said second rail; and
  first and second parallel-connected output stages, said first output stage comprising:
    a small signal amplifier connected between said rails which receives first and second input signals applied to respective input nodes and provides an output signal at an output node suitable for driving a load, said small signal amplifier arranged such that said output signal varies approximately linearly with the difference voltage between said input signals when said difference voltage is less than a predetermined threshold;
  said second output stage comprising:
    a large signal output boost stage connected directly to said output node which, when said difference voltage is greater than said predetermined threshold, is arranged to drive said output node close to said first or second supply rail so as to provide load currents which might otherwise overload said small signal amplifier, said second output stage arranged such that it is off when said difference voltage is less than said predetermined threshold.

2. An amplifier circuit, comprising:
  first and second power supply rails, said first rail being positive with respect to said second rail;

a small signal amplifier connected between said rails which receives first and second input signals applied to respective input nodes and provides an output signal at an output node suitable for driving a load, said small signal amplifier arranged such that said output signal varies approximately linearly with the difference voltage between said input signals when said difference voltage is less than a predetermined threshold;

a large signal output boost stage connected to said output node which, when said difference voltage is greater than said predetermined threshold, is arranged to drive said output node close to said first or second supply rail so as to provide load currents which might otherwise overload said small signal amplifier; and a load circuit connected to said output node and which provides said second input signal as a feedback signal, said amplifier circuit arranged such that said large signal output boost stage drives said output node close to said first or second supply rail so as to reduce the difference voltage between said first and second input signals.

3. The amplifier circuit of claim 2, wherein said large signal output boost stage is arranged to drive said output node close to said first supply rail when said second input signal is negative with respect to said first input signal and to drive said output node close to said second supply rail when said second input signal is positive with respect to said first input signal.

4. The amplifier circuit of claim 2, wherein said load circuit is an LCD display panel.

5. An amplifier circuit, comprising:
first and second power supply rails, said first rail being positive with respect to said second rail;
a small signal amplifier connected between said rails which receives first and second input signals applied to respective input nodes and provides an output signal at an output node suitable for driving a load, said small signal amplifier arranged such that said output signal varies approximately linearly with the difference voltage between said input signals when said difference voltage is less than a predetermined threshold; and
a large signal output boost stage connected to said output node which, when said difference voltage is greater than said predetermined threshold, is arranged to drive said output node close to said first or second supply rail so as to provide load currents which might otherwise overload said small signal amplifier;
wherein said small signal amplifier comprises a current feedback amplifier.

6. The amplifier circuit of claim 5, wherein said current feedback amplifier comprises:
first and second transistors of opposite polarity having their control inputs coupled to said first input node and biased to operate as followers;
third and fourth transistors of opposite polarity connected to conduct respective currents to said second input node in response to the outputs of said first and second follower transistors, respectively;
a first current mirror connected to mirror the current conducted by said third transistor to a fourth node;
a second current mirror connected to mirror the current conducted by said fourth transistor to said fourth node; and
an output stage which provides said small signal amplifier's output signal in response to the voltage at said fourth node.

7. The amplifier circuit of claim 6, wherein said current feedback amplifier's output stage is a totem pole output stage.

8. The amplifier circuit of claim 7, wherein said totem pole output stage comprises:
first and second current sources which provide respective bias currents;
a fifth transistor having its gate connected to said fourth node, its source connected to the output of said first bias current source at a fifth node, and its drain connected to the output of said second bias current source at a sixth node;
a diode-connected transistor connected between said fifth node and a seventh node;
a seventh transistor connected between said first supply rail and said output node which is driven by the voltage at said seventh node;
a diode-connected transistor connected between said seventh node and an eighth node;
a resistor connected between said output node and said eighth node; and
an ninth transistor having its gate connected to said sixth node, its drain connected to said eighth node, and its source connected to said second supply rail;
said totem pole output stage arranged such that said output node approximately tracks the voltage at said fourth node.

9. The amplifier circuit of claim 6, wherein said first current mirror includes a first diode-connected transistor connected between said first supply rail and said third transistor and said second current mirror comprises a second diode-connected transistor connected between said second supply rail and said fourth transistor, said large signal output boost stage comprising:
a fifth transistor connected to form a current mirror with said first diode-connected transistor which conducts a first boost current to said output node; and
a sixth transistor connected to form a current mirror with said second diode-connected transistor which conducts a second boost current to said output node, said fifth and sixth transistors arranged such that:
said fifth transistor turns on and drives said output node close to said first supply rail when said difference voltage is greater than said predetermined threshold and said second input signal is negative with respect to said first input signal, and
said sixth transistor turns on and drives said output node close to said second supply rail when said difference voltage is greater than said predetermined threshold and said second input signal is positive with respect to said first input signal.

10. The amplifier circuit of claim 9, wherein said first and second diode-connected transistors and said fifth and sixth transistors have respective threshold voltages, said fifth and sixth transistors arranged such that their threshold voltages are greater than those of said first and second diode-connected transistors.

11. The amplifier circuit of claim 10, wherein said first and second diode-connected transistors are MOSFETs and said fifth and sixth transistors are DMOS devices.

12. The amplifier circuit of claim 6, further comprising:
seventh and eighth transistors connected between said first supply rail and fifth and sixth nodes, respectively; and
ninth and tenth transistors connected between said second supply rail and seventh and eighth nodes, respectively;
wherein said first current mirror comprises:

a first diode-connected input transistor connected in series between said fifth node and said third transistor, and an output transistor connected in series between said sixth node and said fourth node;

and said second current mirror comprises:

a second diode-connected transistor connected in series between said seventh node and said fourth transistor, and an output transistor connected in series between said eighth node and said fourth node;

said large signal output boost stage comprising:

an eleventh transistor connected to form a current mirror with said first diode-connected transistor which conducts a first boost current to said output node; and a twelfth transistor connected to form a current mirror with said second diode-connected transistor which conducts a second boost current to said output node, said seventh and eighth transistors sized and biased such that they operate in the triode region when said difference voltage is less than said predetermined threshold and operate in the saturation region when said difference voltage is greater than said predetermined threshold and said second input signal is negative with respect to said first input signal, such that said eleventh transistor is turned on and drives said output node close to said first supply rail when said difference voltage is greater than said predetermined threshold and said second input signal is negative with respect to said first input signal, and said ninth and tenth transistors sized and biased such that they operate in the triode region when said difference voltage is less than said predetermined threshold and operate in the saturation region when said difference voltage is greater than said predetermined threshold and said second input signal is positive with respect to said first input signal, such that said twelfth transistor turns on and drives said output node close to said second supply rail when said difference voltage is greater than said predetermined threshold and said second input signal is positive with respect to said first input signal.

13. The amplifier circuit of claim 12, further comprising:

a first protection circuit connected to limit the voltage excursion at the gate of said eleventh transistor when the current demanded by said load is greater than said predetermined threshold and said second input signal is negative with respect to said first input signal; and a second protection circuit connected to limit the voltage excursion at the gate of said twelfth transistor when the current demanded by said load is greater than said predetermined threshold and said second input signal is positive with respect to said first input signal.

14. The amplifier circuit of claim 13, wherein said first and second protection circuits comprise respective zener diodes.

15. The amplifier circuit of claim 12, wherein said eleventh and twelfth transistors are DMOS devices.

16. The amplifier circuit of claim 6, further comprising:

a seventh transistor connected between said first supply rail and a fifth node; and an eighth transistor connected between said second supply rail and a sixth node;

wherein said first current mirror comprises:

a first diode-connected input transistor connected in series between said fifth node and said third transistor, and an output transistor connected in series between said fifth node and said fourth node;

and said second current mirror comprises:

a second diode-connected transistor connected in series between said sixth node and said fourth transistor, and an output transistor connected in series between said sixth node and said fourth node;

said large signal output boost stage comprising:

a ninth transistor connected to form a current mirror with said first diode-connected transistor which conducts a first boost current to said output node; and a tenth transistor connected to form a current mirror with said second diode-connected transistor which conducts a second boost current to said output node, said seventh and eighth transistors sized and biased such that they operate in the triode region when said difference voltage is less than said predetermined threshold and operate in the saturation region when said difference voltage is greater than said predetermined threshold, such that:

said ninth transistor drives said output node close to said first supply rail when said difference voltage is greater than said predetermined threshold and said second input signal is negative with respect to said first input signal, and said tenth transistor drives said output node close to said second supply rail when said difference voltage is greater than said predetermined threshold and said second input signal is positive with respect to said first input signal.

17. The amplifier circuit of claim 6, wherein said first, second, third and fourth transistors are arranged so as to minimize the offset voltage between said first and second input nodes under quiescent operating conditions.

18. The amplifier circuit of claim 17, wherein said first, second, third and fourth transistors are bipolar transistors, and are sized such that their respective base-emitter voltages are approximately equal when conducting equal currents.

19. An amplifier circuit, comprising:

first and second power supply rails, said first rail being positive with respect to said second rail;

a small signal amplifier connected between said rails which receives first and second input signals applied to respective input nodes and provides an output signal at an output node suitable for driving a load, said small signal amplifier arranged such that said output signal varies approximately linearly with the difference voltage between said input signals when said difference voltage is less than a predetermined threshold; and a large signal output boost stage connected to said output node which, when said difference voltage is greater than said predetermined threshold, is arranged to drive said output node close to said first or second supply rail so as to provide load currents which might otherwise overload said small signal amplifier;

wherein said first and second supply rails each comprise at least two branches, said amplifier circuit arranged such that the supply rail branches powering said small signal amplifier are different from the branches powering said large signal output boost stage.

20. An amplifier circuit, comprising:

first and second power supply rails, said first rail being positive with respect to said second rail;

a small signal amplifier connected between said rails which receives first and second input signals applied to respective input nodes and provides an output signal at an output node suitable for driving a load, said small signal amplifier arranged such that said output signal varies approximately linearly with the difference voltage between said input signals when said difference voltage is less than a predetermined threshold; and a large signal output boost stage connected to said output node which, when said difference voltage is greater than said predetermined threshold, is arranged to drive said output node close to said first or second supply rail so as to provide load currents which might otherwise overload said small signal amplifier;

wherein said amplifier circuit is arranged such that said large signal output boost stage is off when said difference voltage is less than said predetermined threshold.

* * * * *